United States Patent [19]

Breunsbach et al.

[11] Patent Number: 5,027,841
[45] Date of Patent: Jul. 2, 1991

[54] APPARATUS TO CLEAN PRINTED CIRCUIT BOARDS

[75] Inventors: Rex Breunsbach, Clackamas; Paul M. Austen, Milwaukie, both of Oreg.

[73] Assignee: Electronic Controls Design, Inc., Milwaukie, Oreg.

[21] Appl. No.: 513,665

[22] Filed: Apr. 24, 1990

[51] Int. Cl.⁵ ................................................ B08B 3/02
[52] U.S. Cl. ........................................ 134/95; 134/102; 134/113; 134/200; 134/902
[58] Field of Search ............... 134/902, 95, 102, 113, 134/172, 179, 200

[56] References Cited

U.S. PATENT DOCUMENTS

| | | | |
|---|---|---|---|
| 3,489,608 | 1/1970 | Jacobs et al. | 134/102 X |
| 4,132,567 | 1/1979 | Blackwood | 134/102 X |
| 4,589,926 | 5/1986 | Holmstrand | 134/72 X |
| 4,635,666 | 1/1987 | Daley et al. | 134/902 X |
| 4,640,719 | 2/1987 | Hayes et al. | 134/40 |
| 4,643,774 | 2/1987 | Kishida et al. | 134/11 |
| 4,731,154 | 3/1988 | Hausman Hazlitt et al. | 134/902 X |
| 4,740,247 | 4/1988 | Hayes et al. | 134/42 |
| 4,740,249 | 4/1988 | McConnell | 134/25.4 |
| 4,749,440 | 6/1988 | Blackwood et al. | 134/902 X |
| 4,778,532 | 10/1988 | McConnell et al. | 134/10 |
| 4,784,169 | 11/1988 | Striedieck | 134/902 X |
| 4,827,867 | 5/1989 | Takei et al. | 134/902 X |
| 4,852,516 | 8/1989 | Rubin et al. | 134/902 X |
| 4,871,417 | 10/1989 | Nishizawa et al. | 134/902 X |
| 4,984,597 | 1/1991 | McConnell et al. | 134/95 |

*Primary Examiner*—Philip R. Coe
*Attorney, Agent, or Firm*—Klarquist, Sparkman, Campbell, Leigh & Whinston

[57] ABSTRACT

A batch cleaning system which can use a combustible solvent to clean printed circuit boards or other electronic assemblies is disclosed. An inner enclosure is sealed by a door. A rack for supporting printed circuit boards or other electronic assemblies or the like is mounted inside the inner enclosure. A plurality of spray nozzles are mounted within the inner enclosure. The inner enclosure is purged of air by introducing an inert gas. Combustible solvent is introduced into the bottom of the inner enclosure where it is pumped through the spray nozzles to clean the printed circuit boards. The contamination level of the solvent is measured and recorded. The solvent is drained back into a solvent holding tank upon completion of the cleaning cycle for subsequent reuse during the next cleaning cycle.

6 Claims, 3 Drawing Sheets

FIG. 1
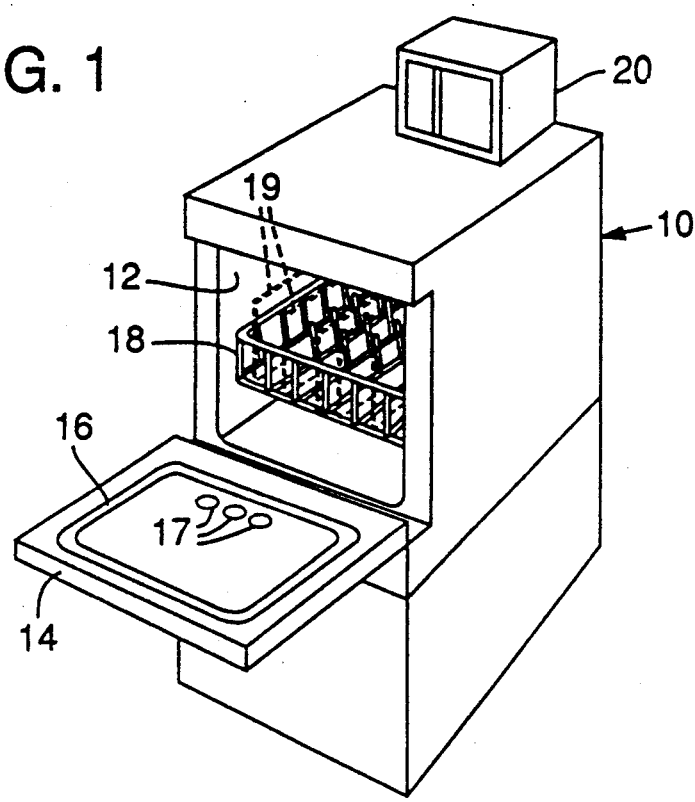
FIG. 6
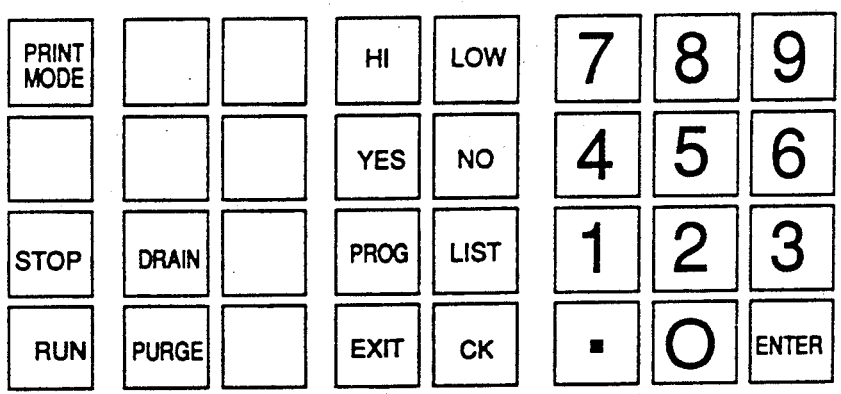
FIG. 7
```
04/13/90  11:36:56  Lot 025
*************************
* 6307 SOLVENT CLEANER   *
*      Version 01.01     *
*     Machine Number 69  *
*************************
      CLEANING CYCLE
PURGE              11:38:59
FILL               11:42:01
    Nitrogen        2.3 PSI
WASH               11:43:04
    Sump Temp       24 C
    Motor Temp      38 C
    Solvent S>O>    .850
DRAIN              11:44:05
CYCLE COMPLETE     11:46:09
*************************
```

APPARATUS TO CLEAN PRINTED CIRCUIT BOARDS

TECHNICAL FIELD

This invention relates to a method and apparatus to clean printed circuit boards. Specifically a batch cleaning system is disclosed which may use combustible solvents in an enclosure to remove residue and contamination from printed circuit wiring boards and other electronic components.

BACKGROUND ART

During the assembly of components on printed circuit wiring boards, soldering fluxes are first applied to the substrate board material to insure that the solder will firmly bond the components to the wiring traces imprinted on the printed circuit board. Generally, these fluxes are either rosin-based or non-rosin-based fluxes. Non-rosin-based fluxes are generally water soluble and removal does not cause any major problems.

Rosin-based fluxes, however, because of their reliability, are used for military applications and other areas where greater reliability is required. These rosin-based fluxes are not easily removed with water alone. Typically, these fluxes are removed with the use of solvents. Chlorinated hydrocarbon solvents have been found to be useful for this purpose but these solvents are toxic and not readily bio-degradable, and are, therefore, hazardous for a long period of time. Fluorocarbon solvents have also been found useful for this purpose. These solvents, however, when released in the atmosphere, destroy the ozone layer in the atmosphere and are, therefore, no longer preferred. Haves, et al., U.S. Pat. Nos. 4,640,719 and 4,740,247, disclose a new terpene solvent which is suitable for removing rosin-based fluxes from printed circuit boards. Unfortunately, terpene solvents are combustible.

Apparatus to contain and apply solvents for cleaning printed circuit boards can be generally classified into continuous systems and batch systems. Kishida, et al., U.S. Pat. No. 4,589,926, discloses a linear continuous system for cleaning printed circuit boards. The printed circuit boards are carried by a cassette which is placed in one end of the apparatus and advanced through zones within the apparatus. In one of the zones, liquid solvent is sprayed on the printed circuit board while brushes simultaneously scrub the board. The solvent is collected, vaporized, and distilled to remove impurities prior to being reused. Although this apparatus is suitable for the particular solvent used, namely "Arklone ®", a carbon fluoride 113, it is not practical for combustible solvents because solvent vapors can still enter the atmosphere from the entrance or the exit end of the apparatus, creating a fire hazard.

Batch systems have been devised such as shown in Kishida. et al., U.S. Pat. No. 4,643,774, for cleaning substrate. Kishida, however, immerses the substrate into an open wash liquid container. This allows wash liquid vapors to enter the atmosphere. Drying air is also directed at the substrate as they are removed from the wash liquid container, further forcing wash liquid vapor into the air. Kishida, therefore, would not be useful for combustible or toxic solvents.

Conventional commercial dishwashers have been used to remove water-based fluxes from printed circuit boards. Commercial dishwashers are not readily adaptable to use combustible solvents for cleaning the boards because of the potential of explosion and the adverse effect the solvents have on the interior and the seals used in the conventional washing machine.

Therefore, a need exists for an improved batch cleaning system for printed circuit wiring boards which can safely use combustible solvents for cleaning the boards.

SUMMARY OF THE INVENTION

It is an object of the invention to provide an improved apparatus to batch clean printed circuit boards using combustible solvents.

It is another object of the invention to provide a batch cleaner for printed circuit boards which can test the contamination level of the solvent used for cleaning the boards.

Still another object of the invention is to provide a batch cleaner for printed circuit boards which can monitor and record the various parameters of the cleaning cycle.

Another object of the invention is to provide a batch cleaner for printed circuit boards wherein the various parameters of the cleaning cycle are programmable by the user.

It is also an object of the invention to provide a batch cleaner for printed circuit boards which can safely use and contain toxic or combustible solvents and safely entrap these solvents after use.

Yet another object of the invention is to provide a batch cleaning system for printed circuit boards which can capture and reuse a combustible solvent for cleaning printed circuit boards or other electronic assemblies.

The apparatus of the present invention includes an inner enclosure of corrosion resistant material and an outer enclosure about the inner enclosure. A door which is operable from the front seals the inner enclosure to form a liquid-tight enclosure. A rack which is movable within the enclosure is slidable outside the enclosure when the door is open. The rack is adapted to hold a plurality of printed circuit wiring boards having electronic components assembled thereon. A plurality of spray nozzles is located in the inner enclosure. Nitrogen gas is introduced into the inner enclosure when the door is closed to purge the enclosure of air. The air is exhausted through passages in the door. A solvent is introduced into the interior enclosure and pumped through the nozzles to spray the solvent onto the printed circuit boards. Upon completion of the cleaning cycle, the solvent is drained, by gravity, back into its holding tank to be used for another cleaning cycle.

Other objects and advantages of the present invention will be apparent from the following description of a preferred embodiment thereof and from the attached drawings.

BRIEF DESCRIPTION OF THE DRAWINGS

FIG. 1 is a perspective view of an apparatus to clean printed circuit boards of the present invention.

FIG. 6 is a front view of the keyboard of the controller of the present invention.

FIG. 7 is a typical output tape from the printer of the controller of the present invention.

DETAILED DESCRIPTION OF THE INVENTION

Figure 2:
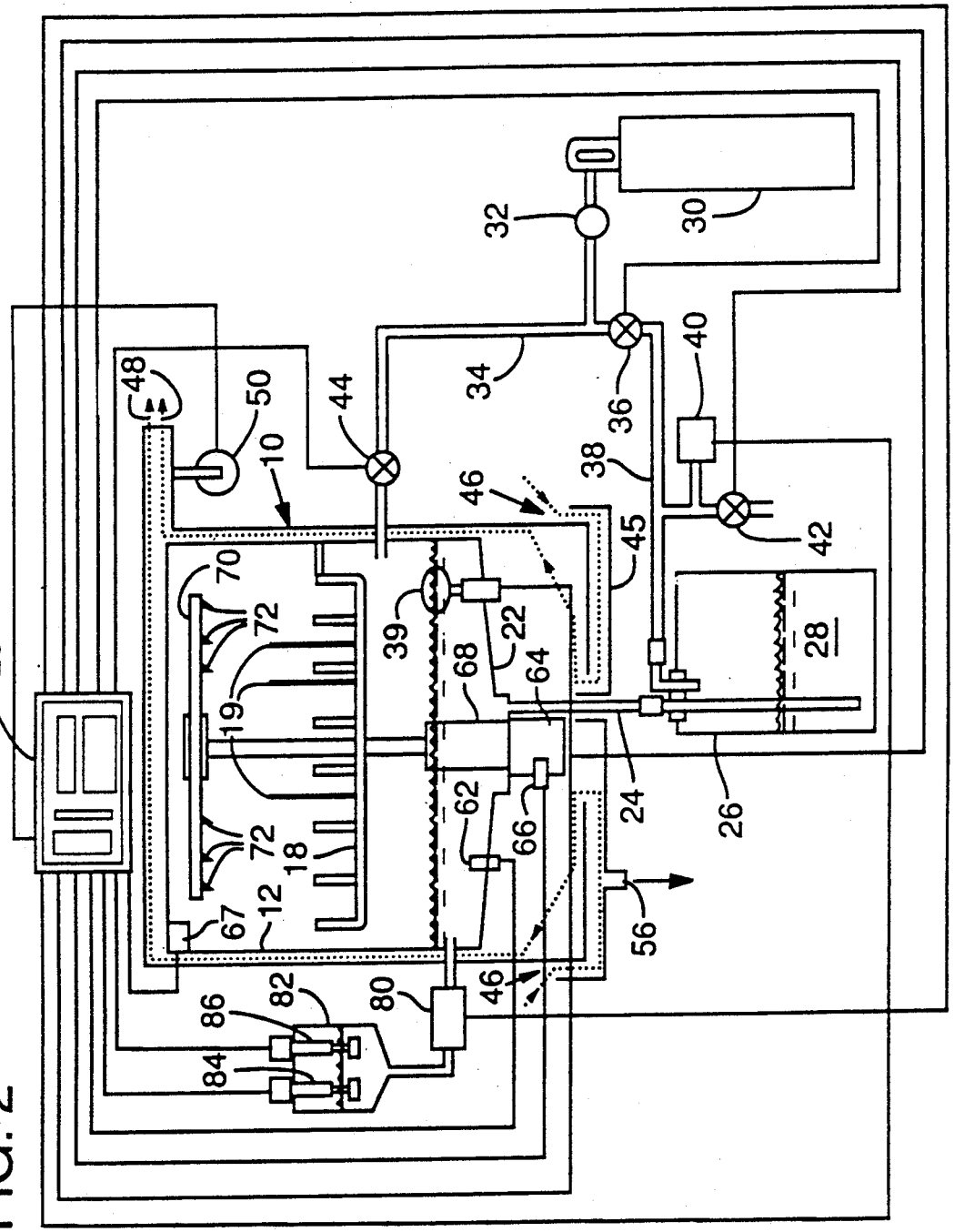
FIG. 2 is a schematic diagram of the apparatus to clean printed circuit boards of the present invention showing the components and wiring thereof.

Referring now to FIG. 1 and FIG. 2, the batch cleaning apparatus of the present invention has an outer enclosure 10 surrounding an inner enclosure 12. The inner enclosure 12 is made of a corrosion resistant material such as stainless steel or the like. A door 14 hinged to the outer enclosure 10. A seal 16 is located on the front of the apparatus to seal the door 14 to the inner enclosure to form a liquid-tight enclosure. A liquid-tight air vent 17 is provided in the door 14 to allow escape of any pressure build-up within the enclosure 12. When the door 14 is closed, the inner enclosure 12 becomes a liquid-tight enclosure. A rack assembly 18 adapted to hold printed circuit boards 19 or other electronic components is slidable into and out of the inner enclosure 12 when the door 14 is open.

A microprocessor-based controller 20 controls the cleaning cycle for the batch cleaner, receives signals from various components, and issues command signals to other components.

The inner enclosure 12 has a lower area or sump 22. A feed pipe 24 communicates with the sump 22 and with a solvent container 26. The solvent container 26 contains a solvent 28, preferably a terpene compound such as disclosed by Hayes, et al., U.S. Pat. No. 4,640,719. This material is especially suited for removing rosin-based fluxes from printed circuit boards and other electronic assemblies.

A gas container 30 feeds an inert gas such as nitrogen through a pressure regulator 32 into a gas feed pipe 34. A valve 36, when activated by controller 20, allows the regulated gas to flow into a pressure feed pipe 38 and thence into the interior of solvent container or tank 26. This produces a pressure on the top of the solvent 28 which forces the solvent up through the feed pipe 24 into the sump 22 of the inner enclosure 12. The solvent continues to flow into the sump 22 until the level indicator 39 indicates that the sump is at its proper level. The level indicator 39 sends a signal to the controller 20 which closes the valve 36 to hold the level of a solvent 28 at the proper level within the sump 22.

A pressure indicator 40 sends the pressure in the feed line 38 to the controller 20 to assist in controlling this function.

In draining the sump 22 of solvent 28, a pressure relief valve 42 under control of controller 20 is opened, exhausting the gas in feed line 38 and within the solvent holding tank 26, thus allowing the solvent in the sump 22 to flow back into the solvent holding tank 26 via gravity.

An additional valve 44 in pressure feed line 34 under control of controller 20 purges the inner enclosure 12 of air by forcing nitrogen into the inner enclosure 12. The nitrogen, being lighter than air, lies atop the air within the inner enclosure 12 and forces the air out the vents 17 in door 14. Vents 17 may communicate directly to the atmosphere through the top of door 14 or may be collected by a plenum as will be explained below.

A drip pan 45 fits below the outer enclosure 10 and the inner enclosure 12 to collect any solvent which may leak from the inner enclosure. A space exists between the outer enclosure 10 and the inner enclosure 12 to form a path for air flow 46 between the inner and outer enclosure. A plenum outlet 48 is provided to exhaust air which passes between the inner enclosure 12 and the outer enclosure 10 or from the door vent 17 to the atmosphere. A fan proving switch 50 is located in the outlet air flow to detect whether air is being pulled from the plenum. Switch 50 sends a signal to controller 20. Should no air flow be detected by switch 50, the cycle is aborted, the sump 22 is drained of solvent 28, and an alarm light is lit as will be explained below. A drain 56 is provided in drip pan 45 to drain away any collected solvent.

Additional safety devices are also provided. A sump temperature sensor 62 continuously monitors the temperature in the sump 22 of the inner enclosure 12. This signal is fed to the controller 20. Should the temperature sensor 62 detect an over-temperature condition, the cleaning cycle is immediately terminated, and the solvent is drained back into the solvent holding tank 26.

A motor 64 driving a first pump 68 is provided for pumping the solvent during the cleaning cycle. A motor temperature sensor 66 constantly monitors the temperature of the motor and sends a signal to the controller 20. Should the motor 64 over-heat, the controller 20 terminates the cleaning cycle and drains the solvent from the sump 22 back into the solvent holding tank 26.

A door interlock switch 67 detects when the door 14 is open. The switch sends a signal to the controller 20 which prevents the door from being opened if solvent is present in the sump 22. Attempts to open door 14 during a cycle will abort the cycle and the solvent will be drained back into container 26.

Pump 68 pumps solvent from the sump 22 up through a supply tube to a spray arm 70. The solvent exits nozzles 72 located on the spray arm 70 to spray solvent down upon rack 18 and, thus, onto the electronic assemblies held by the rack 18. The nozzles 72 in an alternate embodiment may be located beneath rack 18 or on the side walls of inner enclosure 12.

The motor 64 may also rotate the spray arm 70. Alternately, the spray arm 70 may be rotated by the jet action of the solvent exiting the nozzles 72. Controller 20 which controls the operation of the motor 64 continues the cleaning cycle for the preprogrammed amount of time.

An additional or second pump 80, under control of the controller 20, is provided to fill a contamination detection cell 82. The contamination detection cell 82 includes a temperature and level detector 86 and a specific gravity detector 84. Specific gravity detector 84 sends its signal to controller 20. The level sensor and temperature sensor 86 also sends its signal to controller 20. Based upon the combination of these signals, the controller 20 can calculate the specific gravity of the solvent used for cleaning the printed circuit boards. The specific gravity of the solvent increases as flux and other contaminants become dissolved in the solvent. The specific gravity of the solvent is therefore an indication of the purity or cleanliness of the solvent. Once the specific gravity of the cleaning solvent becomes greater than a predetermined level, a signal is generated that the solvent should be replaced. During normal cleaning cycles, the specific gravity of the solvent is recorded on a hard copy from the controller 20 as will be explained below. Upon completion of the contamination test, the pump 80 is deactivated by the controller 20 and the solvent is allowed to drain back into the sump 22 via gravity.

Referring now to FIG. 3 through FIG. 7, the various components of the controller 20 are shown in detail. A display 100 shows the parameters that the controller has been preprogrammed to accept. The controller 20 is a microprocessor-based controller which can be preprogrammed for various cleaning parameters as will be explained below.

Figures 3, 4, 5:
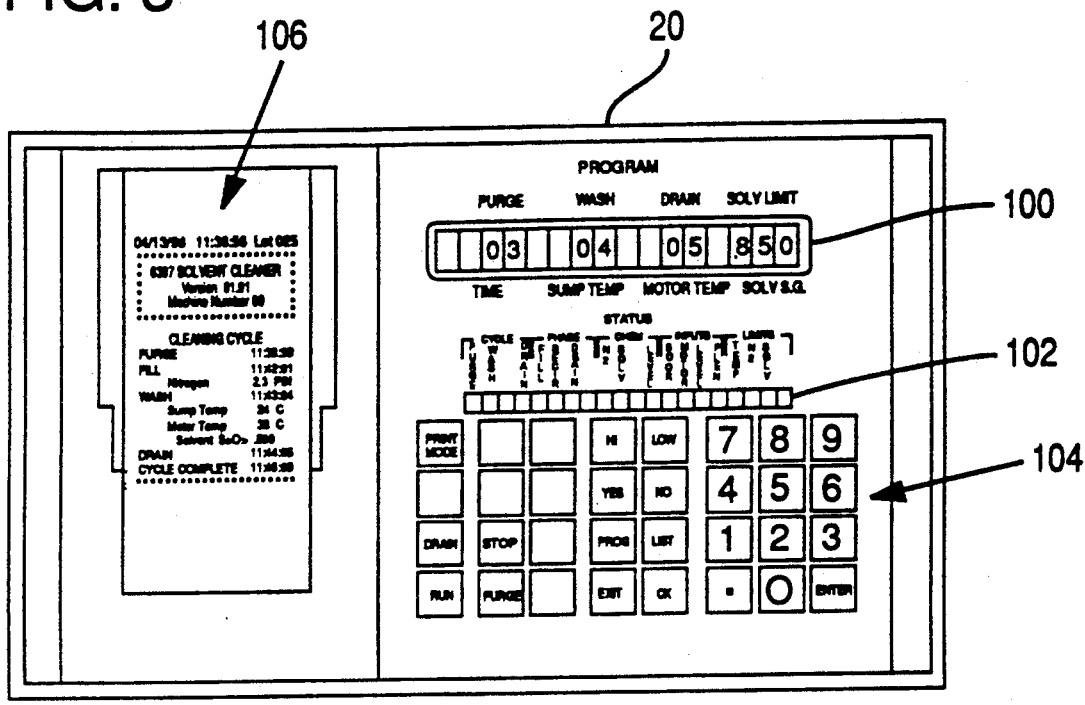
FIG. 3 is a front view of the controller of the present invention.
FIG. 4 is a front view of the program display of the controller of the present invention.
FIG. 5 is a front view of the status display of the controller of the present invention.

As shown in FIG. 4, the amount of purge time can be preset from a range of 3 to 99 minutes. The display 100 indicates this time as a two-digit field, in minutes. The wash cycle also can be preset from a range of 0 to 99 minutes. Again, a two-digit display indicates the wash time in minutes. The drain time can also be preset from 2 to 99 minutes and the amount of preprogrammed time for draining is shown as a two-digit display. Specific gravity for the solvent is a three-digit field with a range of 0 to 0.999. This indicates the acceptable level of the specific gravity of the solvent.

A status display 102 shown in detail in FIG. 5 is also provided. Various lights are lit on the status display 102 during various cycles of the wash program. During the cycles, such as purge, wash, and drain, lights are lit on the status display indicating when these cycles are being performed. Similarly, during a wash cycle, the phase of the wash cycle is indicated as fill, recirculating, or drain with appropriate lights lit during those cycles. The status of the chemicals used during the cleaning cycles, such as the nitrogen, the solvent and the solvent level are also lit when these levels are proper. Should any of the emergency monitoring sensors determine improper conditions, the inputs section of the status indicator display 102 is lit, such as when the door is open, the motor is over heated, the level of a solvent is incorrect, or the plenum combustion sensor has detected a combustible mixture. Similarly, should any of the limits such as temperature, nitrogen pressure, or solvent specific gravity be out of limits, the limit lights indicating those conditions are lit.

A keyboard 104 includes function keys and an numeric keyboard for controlling the controller and presetting the program limits. The detail of the keyboard is shown in FIG. 6. The print mode key allows the operator to toggle the printer 106 on and off. When the printer is toggled off, the printer will not function. The yes/no keys are used during programming of the controller and are used to answer questions during the parameter programming of the controller. The program key prepares the keyboard for programming the various parameters of the wash cycle. The exit key is used for terminating the programming. The list key allows the printer 106 to print all of the parameters which have been programmed into the controller 20. A stop key is used for an emergency stop for the washing cycle. The emergency stop key automatically causes the solvent 28 to drain back into the solvent enclosure 26. The drain key allows the solvent to be drained without stopping the remainder of the washing cycle. The purge key allows the inner enclosure 12 to be purged with nitrogen without affecting any of the other program cycles.

The printer 106, during normal operation, prints a hard copy record, such as shown in FIG. 7, of the cycle parameters and the temperature parameters of the washing cycle. This hard copy may be used as a control for the batch of the electronic components which were cleaned. The printer also will print error messages in table 1:

TABLE 1

| ERROR MESSAGES | |
|---|---|
| * DOOR/E-STOP | Door or E-STOP switch are open |
| * HI MOTOR TEMP | Motor temperature is above limit |
| * HI SUMP TEMP | Sump temperature is above limit |
| * SOLVENT S.G. | Solvent specific gravity is above limit |
| * SLOW FILL | Time to fill sump with solvent is too long |
| * LOW NITROGEN | Nitrogen pressure is below limit |
| * HI NITROGEN | Nitrogen pressure is above limit |
| * PLENUM FLOW | Air is not flowing in exhaust plenum |
| * SAMPLE LEVEL | Sample chamber is not filling in time allowed |
| * MOTOR THERMAL | Motor has overheated |
| * CYCLE ABORT | A limit or error condition has aborted cleaning cycle |

The printer also can type miscellaneous messages to indicate various other conditions during either programming or washing as shown in Table 2:

TABLE 2

| MISCELLANEOUS MESSAGES | |
|---|---|
| * MANUAL STOP | Cycle has been stopped with the STOP key |
| * MANUAL PURGE | A purge cycle has been started by pressing the PURGE key |
| * MANUAL DRAIN | A drain cycle has been started by pressing the DRAIN key |
| * PROG CHANGE | Cleaning cycle program has been changed |
| * TOO SMALL | Number entered is too small or below minimum allowed |
| * TOO LARGE | Number entered is too large or above maximum allowed |

Operation

To clean printed circuit boards, the door 14 of the cleaner is open and the rack 18 is extended out of the inner enclosure 12. Printed circuit boards 19 are placed in the rack 18 and the door 14 is closed. The door must be firmly closed because the washer will not operate as long as the door open-light shown in FIG. 5 is lit.

The program key shown in FIG. 6 is then held down and the power to the controller 20 is turned on. This allows information concerning lot number, machine number, date, and time to be entered. The first information to be entered is lot number which is a three-digit field with a range of 000 to 999. The display shown in FIG. 4 will prompt for a lot number with "LOT #." The required numbers are entered by pressing the numerical key pad shown in FIG. 6. A beep will be heard after each key is pressed to ensure that the microprocessor of controller 20 has accepted the number. Once the three-digit number has been keyed, the enter button shown in FIG. 6 is pressed. The display will then prompt for a machine number with "MACHINE #." The machine number is a two-digit field with a range of 00-99. Again, the required digits are entered on the key pad and the enter button is pushed. The next prompt shown on the display will be the date and will state "DATE XX/XX/XX." The first two digits indicate the month, the second two digits the day, and the last two digits the year. Again, these digits are entered in sequence on the key pad, and once all six digits are entered, the enter button is pushed. The display will then prompt for the time with "TIME XX/XX/XX." The time is in hours, minutes, and seconds. Once this time has been entered, the machine has been initialized. The exit key is then depressed.

The program key is then pressed again so that the washing parameters may be set. The first parameter to be entered is purge time which is a two-digit field with the range of 03-99 minutes. The purge time has a lower limit of three minutes for safety purposes to insure that the enclosure is purged of air prior to starting any cycle. The display shown in FIG. 4 will blink the particular digit that is required for entering the purge time. Once the purge time has been entered on the keyboard of FIG. 6, and the enter button has been pushed, the display of FIG. 4 will start blinking for a wash time. The wash time is a two-digit field with a range of 00 to 99 minutes. Again, this time is entered on the keyboard of FIG. 6 and the enter button is pushed. The display will then prompt for a drain time by blinking the required digit of the drain time on the display of FIG. 4. Drain time is a two-digit field with the range of 02 to 99 minutes. The lower limit of two minutes is a safety factor to insure that the sump 22 is completely drained of solvent before any other cycle parameters will be allowed. The drain time is entered just as the wash time and purge time is entered. The last field to be entered is the solvent specific gravity limit and is a three-digit field with a range of 0-0.999. Again, the display of FIG. 4 will blink the digit that is required. The decimal point need not be entered when entering this information. Merely, the three-digits of the required specific gravity and then the enter. Once this information has been entered, the exit key is depressed.

The length of the purge, wash, and drain cycles and the solvent specific gravity are best determined for the particular printed circuit board and number of boards to be washed by experimentation. As a trial for the first run of the washer with a new batch of printed circuit boards, it is recommended that the purge time be set at three minutes, the wash time at five minutes, the drain time at two minutes, and the specific gravity at 0.880. After this cleaning cycle, the boards may then be checked for cleanliness and the cycle parameters adjusted accordingly.

Once all of the parameters have been entered, the run button, shown in FIG. 6, is pushed and the cleaning cycle including the purge, wash, and drain cycles automatically commences. Upon the completion of the total cleaning cycle, the printer 106 in the controller 20 will print out a hard copy as shown in FIG. 7 of all the parameters of the cycle. The door 14 is then opened, the rack 18 extended from the interior enclosure, and the printed circuit boards 19 removed for subsequent fabrication.

Having illustrated and described the principles of the invention in a preferred embodiment, it should be apparent to those skilled in the art that the invention can be modified in arrangement and detail without departing from such principles. We claim all modifications coming within the spirit and scope of the following claims.

We claim:

1. An apparatus for cleaning flux or contaminants from printed circuit boards or other electronic assemblies and the like comprising:
   a liquid-tight enclosure;
   a rack means for holding electronic assemblies within said enclosure;
   a plurality of spray nozzles located in said enclosure;
   a means to introduce an inert gas within said enclosure to exhaust air from said enclosure;
   a solvent holding tank for containing a solvent;
   a feed means to force solvent from said solvent holding tank into said enclosure;
   a pump means to pump said solvent in said enclosure through said spray nozzles onto said electronic assemblies on said rack means; and
   a means to drain said solvent from said inner enclosure back into said solvent holding tank.

2. An apparatus for cleaning flux or contaminants from printed circuit boards or other electronic assemblies and the like as recited in claim 1 wherein said feed means includes a means to pressurize said solvent tank with inert gas to force said solvent into said enclosure.

3. An apparatus for cleaning flux or other contaminants from printed circuit boards or other electronic assemblies and the like as recited in claim 1 wherein said spray nozzles are mounted on a rotatable arm.

4. An apparatus for cleaning flux or other contaminants from printed circuit boards or other electronic assemblies and the like as recited in claim 2 wherein said means to drain said solvent from said enclosure includes a means to relieve the pressure from said solvent tank.

5. An apparatus for cleaning flux or other contaminants from printed circuit boards or other electronic assemblies comprising:
   an enclosure;
   a door which opens and closes to allow access to the inside of said enclosure and which when closed forms a liquid-tight seal for said enclosure;
   a rack means for holding printed circuit boards or other electronic assemblies within said enclosure, said rack slidable outside said enclosure when said door is open;
   a rotatable arm located within said enclosure;
   a plurality of spray nozzles located on said rotatable arm;
   a means to introduce an inert gas within said enclosure to displace any air from said enclosure;
   a solvent holding tank for containing a solvent;
   a pressure means to admit pressurized inert gas into said solvent holding tank to force said solvent from said solvent holding tank into said enclosure;
   a pump means to pump said solvent in said enclosure through said spray nozzles onto said printed circuit boards on said rack means; and
   a means to relieve the pressure from said pressure means to allow said solvent to drain from said inner enclosure back into said solvent holding tank via gravity.

6. An apparatus for cleaning printed circuit boards or other electronic assemblies comprising:
   an inner enclosure;
   an outer enclosure about said inner enclosure;
   a door which opens and closes to allow access to the inside of said inner enclosure and which when closed forms a liquid-tight seal for said inner enclosure;
   a rack means for holding printed circuit boards or other electronic assemblies within said inner enclosure, said rack slidable outside said inner enclosure when said door is open;
   a rotatable arm located within said enclosure;
   a plurality of spray nozzles located on said rotatable arm;
   a means to introduce an inert gas within said inner enclosure to displace air from said enclosure;

a solvent holding tank for containing a solvent;

a pressure means to admit pressurized inert gas into said solvent holding tank to force said solvent from said solvent holding tank into said inner enclosure;

a level detection means to determine when the solvent in said inner enclosure has reached a predetermined level;

a pressure regulation means responsive to said level detection means to halt the forcing of the solvent from said solvent holding tank into said inner enclosure to maintain the level of said solvent in said inner enclosure at said predetermined level;

a contamination cell to determine the level of contamination of said solvent;

a first pump means to pump said solvent in said inner enclosure through said spray nozzles onto said printed circuit boards on said rack means;

a second pump means to pump said solvent into said contamination cell;

a means to monitor air flow between said inner enclosure and said outer enclosure to prevent the build up of a combustible mixture;

a first temperature sensor means to detect the temperature of said solvent in said inner enclosure;

a second temperature sensor means to detect the temperature of said second pump means;

a means to relieve the pressure from said pressure means to allow said solvent to drain from said inner enclosure back into said solvent holding tank via gravity after a predetermined time or in response to said combustion detection means or in response to an over-temperature signal from said first or said second temperature sensor means.

* * * * *